(12) United States Patent
Tseng et al.

(10) Patent No.: US 6,555,592 B2
(45) Date of Patent: Apr. 29, 2003

(54) PHOTOTHERMOSETTING COMPOSITION COMPRISING ACRYLATED EPOXY RESIN

(75) Inventors: Chao-Hui Tseng, Hsinchu (TW); Fu-Lung Chen, Hsinchu (TW)

(73) Assignee: Advance Materials Corporation, Taoyuan Hsien (TW)

( * ) Notice: Subject to any disclaimer, the term of this patent is extended or adjusted under 35 U.S.C. 154(b) by 87 days.

(21) Appl. No.: 09/793,631

(22) Filed: Feb. 27, 2001

(65) Prior Publication Data

US 2002/0120031 A1 Aug. 29, 2002

(51) Int. Cl.⁷ .................. G03F 7/004; C08G 59/17; C09D 163/10; G03C 1/73
(52) U.S. Cl. ............... 522/39; 522/53; 522/74; 522/79; 522/80; 522/103; 522/146; 522/170; 525/523; 525/524; 528/365; 528/406; 528/112; 528/115; 430/280.1
(58) Field of Search ............... 522/83, 39, 46, 522/53, 100, 101, 103, 170, 179, 182, 183, 74, 79, 80, 146; 525/523, 524; 528/365, 406, 112, 115; 430/280.1

(56) References Cited

U.S. PATENT DOCUMENTS

| | | | | |
|---|---|---|---|---|
| 4,943,516 A | * | 7/1990 | Kamayachi et al. | 430/280.1 |
| 5,009,982 A | * | 4/1991 | Kamayachi et al. | 430/280.1 |
| 5,100,767 A | * | 3/1992 | Yanagawa et al. | 430/280.1 |
| 5,538,821 A | * | 7/1996 | Kakinuma et al. | 430/18 |
| 5,544,773 A | * | 8/1996 | Haruta et al. | 216/13 |
| 5,554,487 A | * | 9/1996 | Ivory et al. | 427/375 |
| 5,556,735 A | * | 9/1996 | Ivory et al. | 427/96 |
| 5,656,411 A | * | 8/1997 | Ivory et al. | 430/270.1 |
| 5,753,722 A | * | 5/1998 | Itokawa et al. | 522/129 |
| 5,821,031 A | * | 10/1998 | Hashimoto et al. | 430/280.1 |
| 5,990,189 A | * | 11/1999 | Hall et al. | 428/209 |

* cited by examiner

Primary Examiner—Susan W. Berman
(74) Attorney, Agent, or Firm—Bacon & Thomas

(57) ABSTRACT

A photothermosetting composition is described which contains a base resin (A), a photopolymerizable photomonomer or photooligomer (B), a photoinitiator (C), an epoxide compound containing at least two epoxy groups (D), and an organic solvent. The base resin (A) an epoxide compound (a) containing at least two epoxy groups, an unsaturated monobasic acid (b), a saturated or unsaturated dibasic acid (c), and a saturated or unsaturated acid anhydride (d) according to the ratio of (a)/(b)/(c) of 1:0.90~0.95:0.025~0.050 and the acid value of the base resin is in the range of 40~49 mg KOH/g. This photothermosetting component was coating on the substrate, and then dried by baking, exposed by light, developed, irradiated by ultraviolet light or heated, and cured to form a solder mask.

12 Claims, 1 Drawing Sheet

PHOTOTHERMOSETTING COMPOSITION COMPRISING ACRYLATED EPOXY RESIN

BACKGROUND OF THE INVENTION

1. Field of the Invention

This invention is to provide a kind of photothermosetting composition which is composed of a base resin, a photopolymerizable photomonomer or photooligomer, a photoinitiator, an epoxide compound, and an organic solvent. The composition may be coated on the substrate and cured to form a solder mask.

2. Description of the Prior Art

Printed circuit board (PCB) is frequently applied to various electronic products. After finishing circuits of PCB, it needs to be coated with a solder mask (ink, so-called green paint) or solder resist where it does not need to solder to avoid adhesion of solder during the assembly of an electronic device on the circuit board, to seal for moisture resistance and to be an insulator between an electronic device and a conductive wire, to avoid damage to the circuit board from dust, finger print, and moisture air.

Basically, the solder masks are divided into four different types as follows:

(1) Ultraviolet curable: using screen printing for a single-sided board primarily;
(2) Thermosetting: using screen printing for a double-sided board primarily;
(3) Liquid photoimageable solder mask (LPISM): using screen printing, is the most popular method of solder mask at present; and
(4) Dry film photoimageable solder mask.

The coating method for the solder mask can be divided into screen printing, curtain coating, spray coating, roller coating, dip coating, and lamination; and among them the methods of screen printing and curtain coating are much more popular.

Due to the development of high density interconnect (HDI) and high level packaging technique the requirements for a liquid photo solder mask are also very severe, such as non-tacky after prebake; no pressed scar after cooling and exposing to form a mask; a mask must be rigid after postbake; have a good adhesion property; much higher insulation resist; wide process window of prebaking temperature as well as development conditions, the smaller and the better undercut; high resolution and easily rework for stripping; at least 260° C. for the heat resistance; higher glass transition temperature (Tg); 2–3 mil (1/1000 inch) resolution for solder dam; chemical resistance and acid and alkaline resistance.

It needs a chemical treatment after postbaking of solder mask, such as a hot air solder leveling (HASL), an electroless platting, a chemical Tin-immersion, or an organic solderability preservatives (OSP) and golden finger are less used. European Union (E.U.) has legislated to require environmental protection; hence, in March of 1999 E.U. has already passed the second edition of draft in title of "Waste Electrical and Electrical Equipment" (WEEE) which prohibits use of lead metal in electronic products from January of 2004. Therefore, solder mask materials must increase its chemical resistance and heat resistance to suit for the new process, i.e. in the leadless process of chemical Tin-immersion, replacement of HASL, uses very strong acid (pH<1); thus, if solder mask does not have good acid resistance and adhesion property, it is susceptible to bleeding or peeling problems of the solder mask to influence the qualification. Up to date the known solder masks do not meet the required acid resistance and adhesion property during the leadless chemical Tin-immersion process.

In general, LPISM contains "main agent", so-called main part, and "hardener agent", so-called curing part, which is able to produce a cross-link effect with main part. The components of these two agents, however they gather together to be used directly (one liquid type) or they separate before use followed by mixing together, are composed of:

(1) Possessing carboxylic acid group and photopolymerizable double bond of a base resin (A);
(2) Photopolymerizable double bond of monomer or oligomer, (or called photomonomer and photooligomer) (B);
(3) Photoinitiator, (or called photoactive compound) (C);
(4) Curing agent.

As U.S. Pat. Nos. 4,722,947; 4,75,138; 5,087,552; 5,114,830; 5,296,334; and 6,007,966 demonstrated that the modified styrene-maleic anhyhride (SMA) could be used as the base resin; in the process of this kind of resin the side product of water could be produced and remained in the base resin during the esterification. The residual water in the base resin will not facilitate the property of solder mask, and also will decompose the acid anhydride to increase the acid value (>200 mg KOH/g), and will cause uncontrolled problems. Hence, if the acid value is controlled in the range of available value, it has to have a high ratio of unreacted acid anhydride to remain in the base resin, but it will not facilitate the property of solder mask; thus, U.S. Pat. Nos. 4,722,947 and 5,087,552 mentioned that it needs to collect the water or to add dehydrating agent to decrease the amount of the residual water in resin during the preparation of SMA resin. However, good results could not be obtained for the electroless-platting or chemical Tin-immersion process if SMA-containing solder mask was used.

Besides, U.S. Pat. Nos. 4,943,516; 5,009,982; 5,100,767; 5,538,821; and 5,753,722 demonstrated that the acrylic acid-modified epoxy resin, could be used as the base resin, which composed of carboxylic group as well as unsaturated double bond in the side chain of the polymer backbone; or as U.S. Pat. No. 5,821,031 presented that the acrylic acid-modified acrylate copolymer, which composed of carboxylic group as well as unsaturated double bond in the side chain of the polymer backbone. Since the ring opening reaction of the epoxide compound for this kind of photo component was very slow and was not completed, it needed to use the excess of toxic unsaturated monobasic acid (e.g. acrylic acid and its derivatives) to accelerate the reaction be completed; but, it could not avoid unreacted unsaturated monobasic acid to be remained in the component, it not only caused the damage of the human health, but also it lowered down the efficiency of platting process, even it caused the problems of bleeding and peeling during the chemical Tin-immersion process.

Furthermore, as U.S. Pat. No. 5,821,031 describes that if the curing agent contained epoxy moiety, which is sparingly soluble in the diluent, i.e. "solvent-insoluble type" of epoxide compound; its pellet powder needed to be ground by the grinder during the preparation of solder mask, but decrease of the particle size was limited to increase the capital of manufacture, and it had no definite efficiency for heat resistance and chemical resistance.

SUMMARY OF THE INVENTION

Hence, the primary aim of this invention is to solve the drawbacks described above. In order to avoid the presence of the drawbacks described above, this invention is to provide a kind of photothermosetting composition whose property is able to meet the requirements of a leadless chemical Tin-immersion process.

The other aim of this invention is to provide a kind of photothermosetting composition using less of an amount of unsaturated monobasic acid (e.g. acrylic acid and its derivatives), which would cause the damage of human health.

The other aim of this invention is to provide a kind of photothermosetting composition in which the epoxide compound could be firstly dissolved in the formula solvent of solder mask for spare; it omits the process of mechanical grinding resulting the powder dust, and the epoxide compound could be placed in the components of curing agent to omit the electrical consumption of grinding, to decrease capital expenditure for protecting pollution and manufacture.

The other aim of this invention is to provide a kind of photothermosetting component in which the base resin does not possess an irritant acid and also does not cause the corrosive damage for the human health due to the lower amount of the residual acid.

In order to get the results described above, this invention provides a kind of photothermosetting composition which is composed of a base resin (A) containing at least two epoxy groups of epoxide compound (a), containing at least two double bonds and an unsaturated monobasic acid (b), a saturated or unsaturated dibasic acid (c), and a saturated or unsaturated acid anhydride (d) according to the typical ratio, a photopolymerizable photomonomer or photooligomer (B), a photoinitiator (C), containing at least two epoxy groups of epoxide compound (D), and an organic solvent; which is then cured to form a solder mask.

DETAILED DESCRIPTION OF THE PREFERRED EMBODIMENTS

Figure 1:
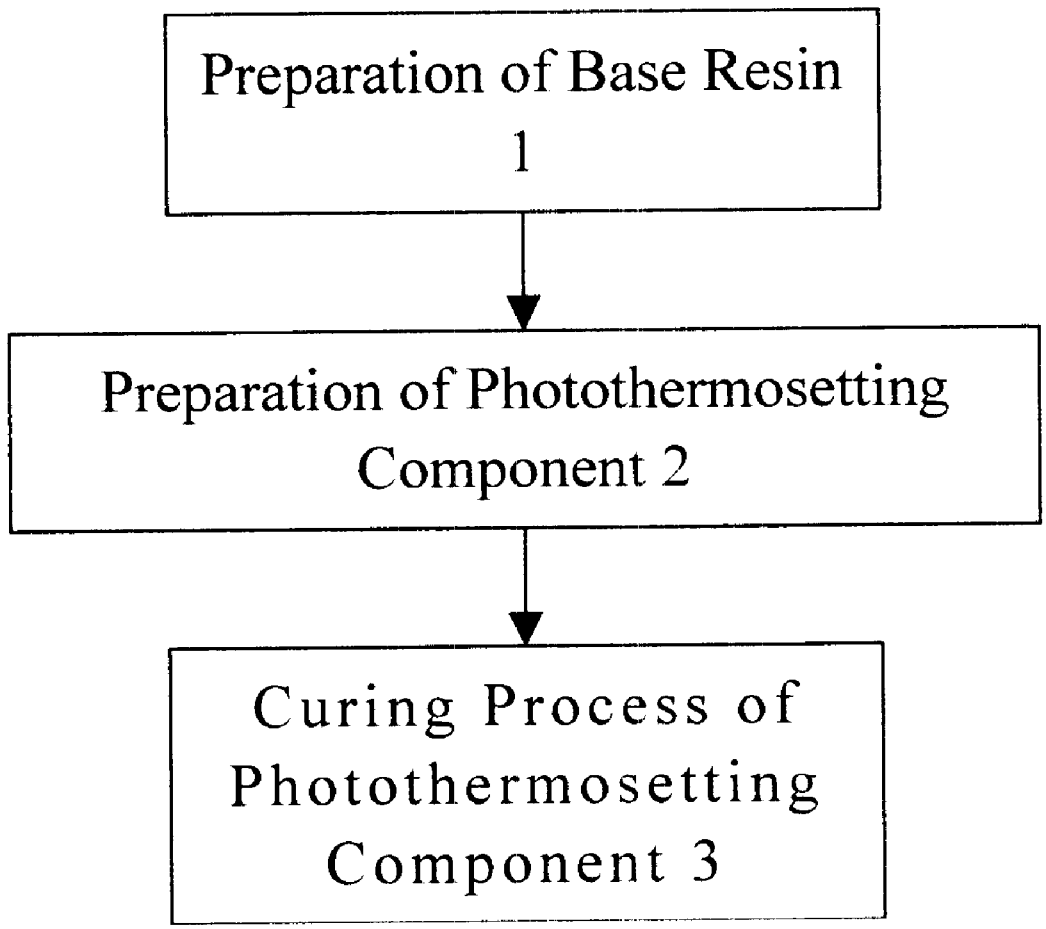
FIG. 1 illustrates the flow chart of a curing process for this invention.

FIG. 1 shows the flow chart of the experimental process for this invention, the preparation of base resin 1 of this invention contains at least two epoxy groups of epoxide compound (a), containing at least two double bonds, and an unsaturated monobasic acid (b), a saturated or unsaturated dibasic acid (c), and a saturated or unsaturated acid anhydride (d). The molar ratio of (a)/(b)/(c) is 1:0.90~0.95:0.025~0.050. It could produce the base resin (A) whose acid value was in the range of 40~49 mg KOH/g in the suitable reaction conditions.

The base resin containing at least two epoxy groups of epoxide compound (a) could be a solid, a semi-solid or a liquid at an ambient temperature including: phenolic and its derivatives of epoxy resins, diphenolic epoxy resins, containing halogen of epoxy resins or acrylate and its derivatives, the more suitable for use could be the epoxy cresol novolak resins, epoxy phenol novolak resin and epoxy acrylate resin, epoxy cresol novolak resin which are commercial available, e.g. LG Chem's N665, N670, N673, N673-80M, N690, N690-80M, N695; Nanya Company's NPCN701, NPCN702, NPCN703, NPCN704; Ciba-Geigy's ECN1273, ECN1280, ECN1285, ECN1299, ECN9511; Company's CNE-200, CNE-202, CNE-220. Epoxy phenol novolak resin from commercial available, e.g. LG Chem's N730 N740, N740-80M, N770, N865, N870; Nanya's NPPN638, NPPN683A80, NPPN638K80; Chang Chun Company's PNE-173, PNE-177, PNE-177H, PNE-177B90. As long as the resin can be dissolved in the solvent during the preparation of resin in order that the reaction was proceeding in the homogeneous phase, the epoxy novolak resin listed above would be chosen for use in this invention.

The unsaturated monobasic acid (b) could be acrylic acid or methacrylic acid, and the former could be more suitable for use. Saturated or unsaturated dibasic acid (c) possesses the structure of HOOC—R—COOH, in which R group could be an aliphatic containing from one carbon atom to twelve carbon atoms or an aromatic; if R group is an aliphatic, saturated dibasic acid (c) could be chosen from at least one of the following listed compounds: fumaric acid, maleic acid, oxalacetic acid, malonic acid and its derivatives, sucGinic acid, glutaric acid and its derivatives, adipic acid and its derivatives, pimelic acid, suberic acid, azelaic acid, and sebacic acid; if R group is an aromatic, unsaturated dibasic acid (c) could be chosen from at least one of from the following listed compounds: terephthalic acid and its derivatives, and isophthalic acid and its derivatives. Saturated or unsaturated dibasic acid (c) could be used alone or be mixed with others for use. Saturated or unsaturated acid anhydride (d) could be chosen from at least one of the following listed compounds: saturated anhydrous hexahydrophthalic acid anhydride and its derivatives, unsaturated anhydrous tetrahydrophthalic acid anhydride and its derivatives, or anhydrous phthalic acid anhydride and its derivatives.

In this invention the preparation of photothermosetting component 2, the photothermosetting component was composed of a 30~50 wt % of base resin (A), a 5~20 wt % of photopolymerizable photomonomer or photooligomer (B), a 2.0~6.0 wt % of photoinitiator (C), a 10~20 wt % of containing at least two epoxy groups of epoxide compound (D), and a 25~40 wt % of organic solvent (E); the sum of contents of (A)~(E) described above was 100 wt %.

The photo component of this invention, photopolymerizable photomonomer or phtooligomer (B) was chosen from Sartomer etc. commercial available; photomonomer, the more suitable for use, could be the bi-functional groups of an aliphatic or containing aromatic ring, e.g. SR205, SR306, CD401, SR508, SR603, SR9036; it could be the tri-functional groups of an aliphatic or containing aromatic ring of photomonomer, e.g. SR350, SR444, CD501, SR9021; it could be the tetra-functional groups of an aliphatic or containing aromatic ring of photomonomer, e.g. SR295, SR355, SR399, SR9041; it could be the penta-functional groups of an aliphatic or containing aromatic ring of photomonomer and the hexa-functional groups of an aliphatic or containing aromatic ring of photomonomer; also, it could be the polyfunctional groups of epoxy acrylate oligomer or the other polyfunctional groups of urethane acrylate oligomer etc., e.g. CN929, CN970, CN104, CN120 etc.; or bought from Photomer etc. commercial available, e.g. a series of 3000, a series of 4000, and a series of 5000 etc.

Photoiniator (C) suitable for use could be the benzoic compound, e.g. benzophenone and anthraquinone etc., commercial available from Ciba-Geigy's Irgacure series of 907, 369, 184, 1173, 1700, 4265, 500; Lambson's Speedcure series or Sartomer series etc.; it could be used alone or be mixed with others for use.

The epoxide compound (D) containing at least two epoxy groups could be a solid, a semi-solid or a liquid at an ambient temperature including: containing phenolic and its derivatives of epoxy resins, containing diphenolic epoxy resins, containing halogen of epoxy resins or acrylate and its derivatives, the more suitable for use could be the containing epoxy cresol novolak resins, epoxy phenol novolak resin and epoxy acrylate resin, epoxy cresol novolak resin was from commercial available, e.g. LG Chem's N665, N670, N673, N673-80M, N680, N690, N690-80M, N695; Nanya's NPCN701, NPCN702, NPCN703, NPCN704; Ciba-Geigy's ECN1273, ECN1280, ECN1285, ECN1299, ECN9511; Chang Chun Company's CNE-200, CNE-202, CNE-220. Epoxy phenol novolak resin was from commercial available, e.g. LG Chem's N730, N740, N740-80M, N770, N865, N870; Nanya's NPPN638, NPPN638K80, NPPN683A80, NPCN70; Chang Chun Company's PNE-173, PNE-177, PNE-177H, PNE-177B90. As long as it dissolved in the solvent of the solder mask formula whatever it was alone for use or mixed with others for use, it could be chosen for use in this invention.

Organic solvent (E) could be chosen from at least one of the following listed: ketone, ether, alcohol, ester or petroleum naphtha; among those ether, ester, and petroleum naphtha were the most suitable for use, e.g. ethylene glycol monomethyl ether acetate, ethylene glycol monobutyl ether, ethylene glycol monobutyl ether acetate, diethylene glycol monoethyl ether, diethylene glycol monoethyl ether acetate, propylene glycol monomethyl ether, propylene glycol monomethyl ether acetate, dipropylene glycol monomethyl ether, Exxon's Aromatic 100, Aromatic 150, Aromatic 200 etc.; it could be used alone or be mixed with others for use.

In addition to components (A)~(D) four components, other compounds or fillers to strengthen the specific property of ink may be added; for example, in order to increase the thermosetting property of epoxy resin dicyandiamide, imidazoles, or amines etc. could be added as could catalysts to the photo components to accelerate thermal polymerization of epoxy resins; in order to increase the surface hardness and chemical resistance etc. of solder mask fillers, e.g. barium sulfate, talc, silica, calcium carbonate, aluminum oxide etc. inorganic compounds; or waxy organic compounds could be added; anti-foaming agent, e.g. silicon, fluorocarbon compound; leveling agent, e.g. fluorocarbon compound, oligomers, silicon, colorant or dye; thermal inhibitor, e.g. hydroquinone and methoxyphenol; and other additives such as dispersant and flame retardant etc. All compounds or fillers described above could be chosen to add to the main part, or to the curing agent, or homogeneously to the mixture of the main part and the curing agent.

Photo components described above should be safely stored, usually it is necessary to separate the main part from the curing agent during formulation, grinding, and storage, they should be mixed homogeneously before coating and had better be consumed within 24 hours. Basically, after formulation of the main part containing fillers and colorant it needs to be blended and dispersed homogeneously, and to be ground to tiny powder by use of a triple roll mill grinder in order that the film of solder mask has a good smooth and shiny appearance. On the other hand, for the curing agent components it could be added or not be added to the filler; addition of filler could increase the content of solid and the viscosity, but it has to be ground to give one more step of the procedure; thus, it needed be dependent on the formulation of components.

In this invention the curing process of photothermosetting components 3 include the following finishing process: photothermosetting components were coated on the substrate, then baked, dried, developed, finally irradiated by ultraviolet light or heated to obtain the hardened material.

EXPERIMENTALS

EXAMPLE 1, THIS INVENTION

To a four-necked reaction vessel was added 220 g of carbitol acetate, 220 g of naphtha 150, then 460 g of epoxy cresol novolak resin. (soft point: 92.5° C., epoxy equivalent weight (EEW): 230) was added at 90° C.; a mixture was blended to be dissolved; then 0.40 g of hydroquinone, 134 g (1.86 mole) of acrylic acid, 11.6 g (0.1 mole) of fumaric acid, and 2.5 g of triphenylphosphine were added. A mixture was heated at 110° C. for 20 hours at least, then 130.7 g (0.86 mole) of tetrahydrophthalic anhydride was added. A reaction mixture was heated continually at 110° C. for 8 hours. Acid value was determined as 45 mg KOH/g.

EXAMPLE 2, THIS INVENTION

To a four-necked reaction vessel was added 220 g of carbitol acetate, 220 g of naphtha 150, then 396 g of epoxy cresol novolak resin ( soft point: 82° C., epoxy equivalent weight (EEW): 198) was added at 90° C.; a mixture was blended to be dissolved; then 0.40 g of hydroquinone, 131 g (1.82 mole) of acrylic acid, 13.14 g (0.09 mole) of adipic acid, and 2.5 g of triphenylphosphine were added. A mixture was heated at 110° C. for 20 hours at least, then 136.8 g (0.90 mole) of tetrahydrophthalic anhydride anhydride was added. A reaction mixture was heated continually at 110° C. for 8 hours. Acid value was determined as 48 mg KOH/g.

EXAMPLE 3, THIS INVENTION

To a four-necked reaction vessel was added 220 g of carbitol acetate, 220 g of naphtha 150, then 430 g of epoxy cresol novolak resin ( soft point: 80° C., epoxy equivalent weight (EEW): 215) was added at 90° C.; a mixture was blended to be dissolved; then 0.40 g of hydroquinone, 134 g (1.86 mole) of acrylic acid, 11.2 g (0.07 mole) of pimelic acid, and 2.5 g of triphenylphosphine were added. A mixture was heated at 110° C. for 20 hours at least, then 139.8 g (0.92 mole) of tetrahydrophthalic anhydride anhydride was added. A reaction mixture was heated continually at 110° C. for 8 hours. Acid value was determined as 44 mg KOH/g.

EXAMPLE 4, THIS INVENTION

To a four-necked reaction vessel was added 220 g of carbitol acetate, 220 g of naphtha 150, then 420 g of epoxy cresol novolak resin ( soft point: 81° C., epoxy equivalent weight (EEW): 210) was added at 90° C.; a mixture was blended to be dissolved; then 0.40 g of hydroquinone, 1350 g (1.88 mole) of acrylic acid, 12.12 g (0.06 mole) of sebacic acid, and 2.5 g of triphenylphosphine were added. A mixture was heated at 110° C. for 20 hours at least, then 142.9 g (0.94 mole) of tetrahydrophthalic anhydride anhydride was added. A reaction mixture was heated continually at 110° C. for 8 hours. Acid value was determined as 46 mg KOH/g.

EXAMPLE 5, THIS INVENTION

To a four-necked reaction vessel was added 220 g of carbitol acetate, 220 g of naphtha 150, then 404 g of epoxy cresol novolak resin ( soft point: 76° C., epoxy equivalent weight (EEW): 202) was added at 90° C.; a mixture was blended to be dissolved; then 0.40 g of hydroquinone, 137 g (1.9 mole) of acrylic acid, 14.3 g (0.05 mole) of thapsic acid, and 2.5 g of triphenylphosphine were added. A mixture was heated at 110° C. for 20 hours at least, then 152 g (1.0 mole) of tetrahydrophthalic anhydride anhydride was added. A reaction mixture was heated continually at 110° C. for 8 hours. Acid value was determined as 43 mg KOH/g.

EXAMPLE 6, THIS INVENTION

To a four-necked reaction vessel was added 220 g of carbitol acetate, 220 g of naphtha 150, then 404 g of epoxy cresol novolak resin ( soft point: 76° C., epoxy equivalent weight (EEW): 202) was added at 90° C.; a mixture was blended to be dissolved; then 0.40 g of hydroquinone, 137 g (1.9 mole) of acrylic acid, 16.6 g (0.1 mole) of phthalic acid, and 2.5 g of triphenylphosphine were added. A mixture was heated at 110° C. for 20 hours at least, then 152 g (1.0 mole) of tetrahydrophthalic anhydride anhydride was added. A reaction mixture was heated continually at 110° C. for 8 hours. Acid value was determined as 49 mg KOH/g.

EXAMPLE 7, COMPARATIVE EXPERIMENT

To a four-necked reaction vessel was added 220 g of carbitol acetate, 220 g of naphtha 150, then 460 g of epoxy cresol novolak resin (soft point: 92.5° C., epoxy equivalent weight (EEW): 230) was added at 90° C.; a mixture was blended to be dissolved; then 0.40 g of hydroquinone, 134 g (1.8 mole) of acrylic acid, and 2.5 g of triphenylphosphine were added. A mixture was heated at 110° C. for 20 hours at least, then 106.4 g (0.70 mole) of tetrahydrophthalic anhydride anhydride was added. A reaction mixture was heated continually at 110° C. for 8 hours. Acid value was determined as 33 mg KOH/g.

EXAMPLE 8, COMPARATIVE EXPERIMENT

To a four-necked reaction vessel was added 220 g of carbitol acetate, 220 g of naphtha 150, then 460 g of epoxy cresol novolak resin (soft point: 92.5° C., epoxy equivalent weight (EEW): 230) was added at 90° C.; a mixture was blended to be dissolved; then 0.40 g of hydroquinone, 172.8 9 (2.40 mole) of acrylic acid, and 2.5 g of triphenylphosphine were added. A mixture was heated at 110° C. for 20 hours at least, then 139.8 g (0.92 mole) of tetrahydrophthalic anhydride anhydride was added. A reaction mixture was heated continually at 110° C. for 8 hours. Acid value was determined as 112 mg KOH/g.

EXAMPLE 9, COMPARATIVE EXPERIMENT

To a four-necked reaction vessel was added 220 g of carbitol acetate, 220 g of naphtha 150, then 430 g of epoxy cresol novolak resin ( soft point: 80° C., epoxy equivalent weight (EEW): 215) was added at 90° C.; a mixture was blended to be dissolved; then 0.40 g of hydroquinone, 134 g (1.86 mole) of acrylic acid, and 2.5 g of triphenylphosphine were added. A mixture was heated at 110° C. for 20 hours at least, then 183 g (1.4 mole) of tetrahydrophthalic anhydride anhydride was added. A reaction mixture was heated continually at 110° C. for 8 hours. Acid value was determined as 76 mg KOH/g.

Examples 1–6 are synthetic base resin of this invention and examples 7–9 are known procedure of synthetic base resin. Table 1a and Table 1b show the molar equivalent of epoxy resin (a), mole of acrylic acid, unsaturated monobasic acid (b), mole of various saturated or unsaturated dibasic acid (c), mole of acid anhydride (d), and the molar ratio of epoxy resin (a)/acrylic acid (b)/saturated or unsaturated dibasic acid (c), and the acid value of prepared resins.

TABLE 1a

Prepared the resin of this invention

|  | Example 1 | Example 2 | Example 3 | Example 4 | Example 5 | Example 6 |
| --- | --- | --- | --- | --- | --- | --- |
| epoxy resins (mole equivalent) | 2.0 | 2.0 | 2.0 | 2.0 | 2.0 | 2.0 |
| acrylic acid (mole) | 1.80 | 1.82 | 1.86 | 1.88 | 1.90 | 1.90 |
| saturated or unsaturated dibasic acid (mole) | Fumaric acid (0.10) | Adipic acid (0.09) | Pimelic acid (0.07) | Sebacic acid (0.06) | Thapsic acid (0.05) | Terephthalic acid (0.10) |
| acid anhydride (mole) | 0.86 | 0.90 | 0.92 | 0.94 | 1.00 | 1.00 |
| epoxy resins/ acrylic acid/ saturated or unsaturated dibasic acid (mole ratio) | 1:0.9:0.05 | 1:0.91:0.045 | 1:0.93:0.035 | 1:0.94:0.03 | 1:0.95:0.025 | 1:0.95:0.05 |
| acid value (mg KOH/g) | 45.0 | 48.0 | 44.0 | 46.0 | 43.0 | 48.0 |

TABLE 1b

Prepared the resin of comparative experiment

|  | Example 7 | Example 8 | Example 9 |
| --- | --- | --- | --- |
| epoxy resins (mole equivalent) | 2.0 | 2.0 | 2.0 |
| acrylic acid (mole) | 1.80 | 2.40 | 1.90 |
| saturated or unsaturated dibasic acid (mole) | — | — | — |
| acid anhydride (mole) | 0.70 | 0.92 | 1.50 |
| epoxy resins/ acrylic acid/ saturated or unsaturated dibasic acid (mole ratio) | 1:0.9:0 | 1:1.2:0 | 1:0.95:0 |
| acid value (mg KOH/g) | 31.0 | 112.0 | 76.0 |

EXAMPLE 10, THIS INVENTION

Example 10 was that the readily prepared base resin obtained from example 1 and the components of main part according to Table 2a were mixed vigorously for 2~3 hours, and then were ground and dispersed by using a triple roll mill grinder. According to Table 2b the curing components were mixed vigorously for 1.5~2 hours to obtain the curing solution; if the curing components contained filler, it had to be ground and dispersed by using a triple roll mill grinder.

Ground main part described above and dissolved completely or ground dispersed completely curing agent were mixed and blended about 15 minutes to form the liquid photothermosetting solder mask of this invention.

EXAMPLE 11, THIS INVENTION

Example 11 was that the readily prepared base resin obtained from example 2 and the components of main part according to Table 2a were mixed vigorously for 2~3 hours, and then were ground and dispersed by using a triple roll mill grinder. According to Table 2b the curing components were mixed vigorously for 1.5~2 hours to obtain the curing solution; if the curing components contained fillers it had to be ground and dispersed by using a triple roll mill grinder.

Ground main part described above and dissolved completely or ground dispersed completely curing agent were mixed and blended about 15 minutes to form the liquid photothermosetting solder mask of this invention.

EXAMPLE 12, THIS INVENTION

Example 12 was that the readily prepared base resin obtained from example 3 and the components of main part according to Table 2a were mixed vigorously for 2~3 hours, and then were ground and dispersed by using a triple roll mill grinder. According to Table 2b the curing components were mixed vigorously for 1.5~2 hours to obtain the curing solution; if the curing components contained filler, it had to be ground and dispersed by using a triple roll mill grinder.

Ground main part described above and dissolved completely or ground dispersed completely curing agent were mixed and blended about 15 minutes to form the liquid photothermosetting solder mask of this invention.

EXAMPLE 13, THIS INVENTION

Example 11 was that the readily prepared base resin obtained from example 4 and the components of main part according to Table 2a were mixed vigorously for 2~3 hours, and then were ground and dispersed by using a triple roll mill grinder. According to Table 2b the curing components were mixed vigorously for 1.5~2 hours to obtain the curing solution; if the curing components contained filler, it had to be ground and dispersed by using a triple roll mill grinder.

Ground main part described above and dissolved completely or ground dispersed completely curing agent were mixed and blended about 15 minutes to form the liquid photothermosetting solder mask of this invention.

EXAMPLE 14, THIS INVENTION

Example 14 was that the readily prepared base resin obtained from example 5 and the components of main part according to Table 2a were mixed vigorously for 2~3 hours, and then were ground and dispersed by using a triple roll mill grinder. According to Table 2b the curing components were mixed vigorously for 1.5~2 hours to obtain the curing solution; if the curing components contained filler, it had to be ground and dispersed by using a triple roll mill grinder.

TABLE 2a

The composition of main part of this invention

| mainpart | Example 10 | Example 11 | Example 12 | Example 13 | Example 14 | Example 15 |
|---|---|---|---|---|---|---|
| ⊙ base resin | Example 1 34.0 | Example 2 38.0 | Example 3 35.0 | Example 4 32.0 | Example 5 30.0 | Example 6 34.0 |
| ⊙ photomonomer/photooligomer | | | | | | |
| Dipentaerythritol hexaacrylate | 3.0 | 6.0 | — | 5.0 | — | — |
| Pentaerythritol tetraacrylate | 11.0 | — | 8.0 | — | 7.0 | 7.0 |
| Dipentaerythritol pentaacrylate | — | 5.0 | — | — | — | — |
| Trimethylolpropane triacrylate | — | — | 4.0 | 2.0 | — | 3.0 |
| Epoxy acrylate | — | — | — | 4.0 | 3.0 | 4.0 |
| ⊙ the others | | | | | | |
| DC350 (Deuchem Trading Co) (leveling agent) | 1.0 | 1.0 | 1.0 | 1.0 | 1.0 | 1.0 |
| KS - 66 (anti-foaming agent) | 1.5 | 1.5 | 1.5 | 1.5 | 1.5 | 1.5 |
| Phthalocyanine green (colorant) | 1.7 | 1.7 | 1.7 | 1.7 | 1.7 | 1.7 |
| barium sulfate | 20.0 | 20.0 | 21.0 | 23.0 | 25.0 | 20.0 |
| Aerosil 200 (silica) | 1.0 | 1.0 | 1.0 | 1.0 | 1.0 | 1.0 |
| Aerosil 972 (silica) | 1.2 | 1.2 | 1.2 | 1.2 | 1.2 | 1.2 |
| Dicyandiamide (catalyst) | 1.5 | 1.5 | 1.5 | 1.5 | 1.5 | 1.5 |
| talc | 4.0 | 4.0 | 4.0 | 4.0 | 4.0 | 4.0 |
| hydroquinone | 0.1 | 0.1 | 0.1 | 0.1 | 0.1 | 0.1 |

TABLE 2a-continued

The composition of main part of this invention

| mainpart | Example 10 | Example 11 | Example 12 | Example 13 | Example 14 | Example 15 |
|---|---|---|---|---|---|---|
| ⓞsolvent | | | | | | |
| Carbitol acetate | 10.0 | 9.5 | 10.0 | 11.0 | 11.5 | 10.0 |
| solvent naphtha 150 | 10.0 | 9.5 | 10.0 | 11.0 | 11.5 | 10.0 |
| total | 100.0 | 100.0 | 100.0 | 100.0 | 100.0 | 100.0 |

TABLE 2b

The composition of curing agent of this invention

| curing agent | Example 10 | Example 11 | Example 12 | Example 13 | Example 14 | Example 15 |
|---|---|---|---|---|---|---|
| ⓞphotoinitiator | | | | | | |
| 2-Methyl-1-(4-(methylthio)phenyl)-2-morpholinopropane-1-one | 4.0 | 3.0 | 3.5 | 4.2 | 3.8 | 4.0 |
| Isopropylthioxanthone | 1.0 | 0.8 | 0.8 | 0.9 | 0.7 | 1.0 |
| ⓞepoxide compound | | | | | | |
| epoxy cresol novolak resin | 16.0$^a$ | 20.0$^b$ | 17.7$^c$ | 10.0$^d$ | 8.0$^e$ | 10.0$^a$ |
| epoxy phenol novolak resin | — | — | — | 8.0$^f$ | 11.0$^f$ | 6.0$^f$ |
| ⓞthe others | | | | | | |
| barium sulfate | — | — | 3.0 | — | 3.0 | — |
| solvent | | | | | | |
| Carbitolacetate | 3.8 | 2.4 | 4.0 | 3.8 | 4.2 | 3.8 |
| solvent naphtha 150 | 3.8 | 2.4 | 4.0 | 3.8 | 4.2 | 3.8 |
| total | 28.6 | 28.6 | 32.9 | 30.7 | 34.9 | 28.6 |

$^a$soft point: 92.5° C., epoxy equivalent weight (EEW): 230:
$^b$soft point: 82° C., epoxy equivalent weight (EEW): 198:
$^c$soft point: 80° C., epoxy equivalent weight (EEW): 215:
$^d$soft point: 81° C., epoxy equivalent weight (EEW): 210:
$^e$soft point: 76° C., epoxy equivalent weight (EEW): 202:
$^f$semi-solid, epoxy equivalent weight (EEW): 180
a to f are epoxy resins which are sparingly soluble in the formula solvent.

Ground main part described above and dissolved completely or ground dispersed completely curing agent were mixed and blended about 15 minutes to form the liquid photothermosetting solder mask of this invention.

EXAMPLE 15, THIS INVENTION

Example 15 was that the readily prepared base resin obtained from example 6 and the components of main part according to Table 2a were mixed vigorously for 2~3 hours, and then were ground and dispersed by using a triple roll mill grinder. According to Table 2b the curing components were mixed vigorously for 1.5~2 hours to obtain the curing solution; if the curing components contained filler, it had to be ground and dispersed by using a triple roll mill grinder.

Ground main part described above and dissolved completely or ground dispersed completely curing agent were mixed and blended about 15 minutes to form the liquid photothermosetting solder mask of this invention.

EXAMPLE 16, COMPARATIVE EXPERIMENT

Example 16 was that the readily prepared base resin obtained from example 7 and the components of main part according to Table 2c were mixed vigorously for 2~3 hours, and then were ground and dispersed by using a triple roll mill grinder. According to Table 2d the curing components were mixed vigorously for 1.5~2 hours to obtain the curing solution; if the curing components contained filler, it had to be ground and dispersed by using a triple roll mill grinder.

TABLE 2c

The composition of main part of comparative experiment

| main part | Example 16 | Example 17 | Example 18 | Example 19 |
|---|---|---|---|---|
| ⓞbase resin | Example 7 | Example 8 | Example 9 | Example 7 |
| | 38.0 | 35.0 | 32.0 | 30.0 |
| ⓞphotomonomer/photo-oligomer | | | | |
| Dipentaerythritol hexa-acrylate | 6.0 | — | 5.0 | — |
| Pentaerythritol tetra-acrylate | — | 8.0 | — | 7.0 |

TABLE 2c-continued

The composition of main part of comparative experiment

| main part | Example 16 | Example 17 | Example 18 | Example 19 |
|---|---|---|---|---|
| Dipentaerythritol penta-acrylate | 5.0 | — | — | — |
| Trimethylolpropane tri-acrylate | — | 4.0 | 2.0 | — |
| Epoxy acrylate | — | — | 4.0 | 3.0 |
| ⓔthe others | | | | |
| DC350 (Deuchem Trading Co) (leveling agent) | 1.0 | 1.0 | 1.0 | 1.0 |
| KS - 66 (anti-foaming agent) | 1.5 | 1.5 | 1.5 | 1.5 |
| Phthalocyanine green (colorant) | 1.7 | 1.7 | 1.7 | 1.7 |
| barium sulfate | 20.0 | 21.0 | 23.0 | 25.0 |
| Aerosil 200 (silica) | 1.0 | 1.0 | 1.0 | 1.0 |
| Aerosil 972 (silica) | 1.2 | 1.2 | 1.2 | 1.2 |
| Dicyandiamide (catalyst) | 1.5 | 1.5 | 1.5 | 1.5 |
| talc | 4.0 | 4.0 | 4.0 | 4.0 |
| hydroquinone | 0.1 | 0.1 | 0.1 | 0.1 |
| ⓕsolvent | | | | |
| Carbitol acetate | 9.5 | 10.0 | 11.0 | 11.5 |
| solvent naphtha 150 | 9.5 | 10.0 | 11.0 | 11.5 |
| total | 100.0 | 100.0 | 100.0 | 100.0 |

TABLE 2d

The composition of curing agent of comparative experiment

| curing agent | Example 16 | Example 17 | Example 18 | Example 19 |
|---|---|---|---|---|
| ⓔphotoinitiator | | | | |
| 2-Methyl-1-((methylthio)phenyl)-2-morpholinopropane-1-one | 3.0 | 3.5 | 4.2 | 3.8 |
| Isopropylthioxanthone | 0.8 | 0.8 | 0.9 | 0.7 |
| ⓔepoxide compound | | | | |
| triglycidyl terephthalate resin[g] | 20.0 | 17.7 | 10.0 | 8.0 |
| bixylenol epoxy resin[h] | — | — | 8.0 | 11.0 |
| ⓔthe others | | | | |
| barium sulfate | — | 3.0 | — | 3.0 |
| ⓔsolvent | | | | |
| Carbitol acetate | 2.4 | 4.0 | 3.8 | 4.2 |
| solvent naphtha 150 | 2.4 | 4.0 | 3.8 | 4.2 |
| total | 28.6 | 32.9 | 30.7 | 34.9 | g and h are epoxy resins which are sparingly soluble in the formula solvent.

Ground main part described above and dissolved completely or ground dispersed completely curing agent were mixed and blended about 15 minutes to form the liquid photothermosetting solder mask of known technique.

EXAMPLE 17, COMPARATIVE EXPERIMENT

Example 17 was that the readily prepared base resin obtained from example 8 and the components of main part according to Table 2c were mixed vigorously for 2~3 hours, and then were ground and dispersed by using a triple roll mill grinder. According to Table 2d the curing components were mixed vigorously for 1.5~2 hours to obtain the curing solution; if the curing components contained filler, it had to be ground and dispersed by using a triple roll mill grinder.

Ground main part described above and dissolved completely or ground dispersed completely curing agent were mixed and blended about 15 minutes to form the liquid photothermosetting solder mask of known technique.

EXAMPLE 18, COMPARATIVE EXPERIMENT

Example 18 was that the readily prepared base resin obtained from example 9 and the components of main part according to Table 2c were mixed vigorously for 2~3 hours, and then were ground and dispersed by using a triple roll mill grinder. According to Table 2d the curing components were mixed vigorously for 1.5~2 hours to obtain the curing solution; if the curing components contained filler, it had to be ground and dispersed by using a triple roll mill grinder.

Ground main part described above and dissolved completely or ground dispersed completely curing agent were mixed and blended about 15 minutes to form the liquid photothermosetting solder mask of known technique.

EXAMPLE 19, COMPARATIVE EXPERIMENT

Example 19 was that the readily prepared base resin obtained from example 7 and the components of main part according to Table 2c were mixed vigorously for 2~3 hours, and then were ground and dispersed by using a triple roll mill grinder. According to Table 2d the curing components were mixed vigorously for 1.5~2 hours to obtain the curing solution; if the curing components contained filler, it had to be ground and dispersed by using a triple roll mill grinder.

Ground main part described above as well as the dissolved completely or ground dispersed completely curing agent were mixed and blended about 15 minutes to form the liquid photothermosetting solder mask of known technique.

Proceeding examples 10~15 of this invention to synthesize photothermosetting components and utilizing examples 16~19 of known technique to synthesize photothermosetting components as well as all kinds of components and contents were summarized as shown in Table 2a, Table 2b, Table 2c, and Table 2d, respectively.

According to examples 10~19 to prepare solder mask, which was employed the screen printing (100 mesh) method to coat on the finished surface of copper foil substrate plate and the prepared circuit of substrate plate homogeneously, respectively; placed in oven at 80° C. for prebake, taken out, cooled down, covered by art work, exposed by using ORC 5 KW ultraviolet light setting on 450 mJ/cm2, then entered in the transporting belt type of developing picture, developing conditions: concentration of developing solution: 1.0 wt % K2CO3 aqueous solution, temperature of developing solution: 30±1° C., spraying pressure: 1.5 kg/cm2, developing time: 90 seconds, obtained the circuit patterns, then placed in oven at 160° C. for bake about 50 minutes, eventually finished the thermal-cured reaction.

To examine the characteristics of this invention it needed to proceed the following evaluation experiments:

I. Prebaking Window Test

Set the oven temperature at 80° C., baked for 30 minutes, 50 minutes, and 70 minutes, respectively, after being exposed and developed, using the optical microscope the 70 mm line/space of circuit was checked whether the development was clean or not.

II. Developing Window Test

Set the oven temperature at 80° C., baked for 30 minutes, placed plates under an ambient temperature and yellow light condition for 48 hours and 72 hours, respectively, after being exposed and developed, using the optical microscope the 70 mm line/space of circuit was checked whether the development was clean or not.

III. Solder Test

Readily prepared patterns and completely cured solder mask of circuit plates were employed to soldering process, 260° C.×10 seconds×3 times, and then were proceeded the adhesion test using 3M tape.

IV. Platting Test

Readily prepared patterns and completely cured solder mask of circuit plates were employed to platting process, nickel thickness 150 min, gold thickness 3 min, and then were proceeded the adhesion test using 3M tape.

work. Referring to photoinitiator (C) in photothermosetting components, the best content is in the range of 2.0~6.0 wt %; if content is too low, it would be short of sensitivity to affect the hardness of mask film; if content is too high, it would cause the limitations such as poor resolution, and was not able to reflect the patterns of art work normally. Referring to epoxide compound (D) in photothermosetting components, its function is to provide thermosetting of base resin, the best content is in the range of 10~20 wt %; if content is too low, it would cause problems such as the hardness of mask film would be not enough after hardbake, the chemical resistance becomes poor; if content is too high, it would cause problem such as the developing window would be not enough. Referring to the organic solvent in photothermosetting components, its purpose is to adjust the solid content of solder mask in order that the thickness of the coating mask would be controlled in the required range after prebake.

TABLE 3

The results of tests for the properties of solder mask.

| | Example 10 | Example 11 | Example 12 | Example 13 | Example 14 | Example 15 | Example 16 | Example 17 | Example 18 | Example 19 |
|---|---|---|---|---|---|---|---|---|---|---|
| Prebaking Window Test | | | | | | | | | | |
| 80° C.*30 min | ○ | ○ | ○ | ○ | ○ | ○ | ○ | ○ | ○ | ○ |
| 80° C.*50 min | ○ | ○ | ○ | ○ | ○ | ○ | Δ | ○ | ○ | Δ |
| 80° C.*70 min | ○ | ○ | Δ | ○ | Δ | ○ | X | ○ | ○ | X |
| Developing Window Test | | | | | | | | | | |
| 48 hr | ○ | ○ | ○ | ○ | ○ | ○ | Δ | ○ | ○ | Δ |
| 72 hr | ○ | ○ | Δ | ○ | Δ | ○ | X | ○ | ○ | X |
| Solder Test | ○ | ○ | ○ | ○ | ○ | ○ | ○ | ○ | ○ | ○ |
| Platting Test | ○ | ○ | ○ | ○ | ○ | ○ | ○ | Δ | Δ | ○ |
| Chemical Tin-immersion Test | ○ | ○ | ○ | ○ | ○ | ○ | ○ | X | X | ○ |

○: development is complete. not scum and foot in circuit.
Δ: part defect in development ' minor scum and foot in circuit °
X: development is failed °

V. Chemical Tin-immersion Test

Readily prepared picture and completely cured solder mask of circuit plates were employed to chemical Tin-immersion process, Tin thickness 40 min, and then were proceeded the adhesion test using 3M tape.

Table 3 illustrated the examination results of the properties of solder mask. In this invention the best acid value is in the range of 40~49 mg KOH/g for photothermosetting components. If the acid value is too low, it causes problems such as poor developing as well as prebake window; if the acid value is too high, it causes problems such as poor chemical resistance, i.e. during the processes of HASL, platting, and chemical Tin-immersion, the adhesion property of solder mask on the copper foil substrate plates would become poor. The most suitable content for base resin in photothermosetting components is in the range of 30~50 wt %, too low or too high of content would cause same problems described above. Referring to photomonomer or photooligomer (B) in photothermosetting components, its function is to strengthen the cross-link density of solder mask, the best content is in the range of 5~20 wt %; if content is too low, it would influence the chemical resistance due to the low cross-link density; if content is too high, it would cause problems such as the mask film would become tacky after prebake, be easily scraped, and pollute the art

What is claimed is:

1. A photothermosetting composition comprising:
   (A) a base resin obtained from the reaction of the following components:
      (a) an epoxy resin composition containing at least two epoxy groups;
      (b) an unsaturated monobasic acid;
      (c) a saturated or unsaturated dibasic acid having the following structure:

HOOC—R—COOH

R: C1~C12, aliphatic or aromatic
      (d) saturated or unsaturated acid anhydride;
         in which, the molar ratio of (a) (b),and (c), is 1:0.90~0.95:0.025~0.050, the acid value of the obtained base resin is in the range of 40~49 mg KOH/g;
   (B) a photopolymerizable photomonomer or photooligomer;
   (C) a photoinitiator;
   (D) an epoxide compound containing at least two epoxy groups which is a solid, semi-solid or liquid at an ambient temperature, or is solid/semi-solid/liquid mixed for use at an ambient temperature and is able to soluble in organic solvent;
   (E) an organic solvent.

2. The photothermosetting composition of claim 1 wherein the content of base resin (A) is in the range of 30~50 wt %, the content of photopolymerizable photomonomer or photooligomer (B) is in the range of 5~20 wt %, the content of photoinitiator (C) is in the range of 2.0~6.0 wt %, the content of compound containing at least two epoxy groups (D) is in the range of 10~20 wt %, the content of organic solvent (E) is in the range of 25~40 wt %, the sum of contents of (A)~(E) described above is 100 wt %.

3. The photothermosetting composition of claim 1 wherein the epoxide resin (a) is epoxy cresol novolak or epoxy phenol novolak resin which is a solid, semi-solid, or liquid at an ambient temperature, or is solid/semi-solid/liquid mixed for use.

4. The photothermosetting composition of claim 1 wherein the unsaturated monobasic acid (b) is acrylic acid or methacrylic acid.

5. The photothermosetting composition of claim 1 wherein the saturated or unsaturated dibasic acid is selected from the group consisting of fumaric acid, maleic acid, oxalacetic acid, malonic acid and its derivatives, succinic acid, glutaric acid and its derivatives, adipic acid and its derivatives, pimelic acid, suberic acid, azelaic acid, sebacic acid, terephthalic acid and its derivatives, and isophthalic acid and its derivatives.

6. The photothermosetting composition of claim 1 wherein the saturated or unsaturated acid anhydride (d) is selected from the group consisting of anhydrous hexahydrophthalic acid anhydride and its derivatives, anhydrous tetrahydrophthalic acid anhydride and its derivatives, or anhydrous phthalic acid anhydride and its derivatives.

7. The photothermosetting composition of claim 1 wherein the photopolymerizable photomonomer or phtooligomer (B) is selected from the group consisting of bi-functional groups of an aliphatic or containing aromatic ring of photomonomer, tri-functional groups of an aliphatic or containing aromatic ring of photomonomer, tetra-functional groups of an aliphatic or containing aromatic ring of photomonomer, penta-functional groups of an aliphatic or containing aromatic ring of photomonomer, hexa-functional groups of an aliphatic or containing aromatic ring of photomonomer, polyfunctional groups of epoxy acrylate oligomer, or the other polyfunctional groups of urethane acrylate oligomer.

8. The photothermosetting composition of claim 1 wherein the photoinitiator is selected from the group consisting of isopropylthioxanthone and 2-methyl-1-(methylthio)phenyl-2- morpholinopropane-1-one.

9. The photothermosetting composition of claim 1 compound (D) is selected from the group consisting of epoxy cresol novolak or epoxy phenol novolak resin; diphenolic epoxy resin, and halogen containing epoxy resin, in a solid or a semi-solid form at an ambient temperature, and is a solid, a semi-solid or a liquid for use, or both are mixed together for use.

10. The photothermosetting composition of claim 1 wherein the organic solvent is selected from the group consisting of a ketone, an ether, an alcohol, an ester, and petroleum naphtha.

11. The photothermosetting composition of claim 1 wherein the formation of material after curing includes the following finishing process: photothermosetting composition is coated on the substrate, then baked, dried, developed, finally irradiated by ultraviolet light or heated to obtain the hardened material.

12. A base resin formed from reaction of the following components:

(a) an epoxide compound containing at least two epoxy groups;

(b) an unsaturated monobasic acid;

(c) a saturated or unsaturated dibasic acid possesses the following structure:

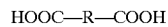

HOOC—R—COOH

R: C1~C12, aliphatic or aromatic (d) an saturated or unsaturated acid anhydride;
wherein the molar ratio of (a), (b), and (c), is 1:0.90~0.95:0.025~0.050, the acid value of obtained base resin is in the range of 40~49 mg KOH/g.

* * * * *